(12) United States Patent
Jansen et al.

(10) Patent No.: US 11,719,529 B2
(45) Date of Patent: Aug. 8, 2023

(54) INTERFEROMETER SYSTEM, METHOD OF DETERMINING A MODE HOP OF A LASER SOURCE OF AN INTERFEROMETER SYSTEM, METHOD OF DETERMINING A POSITION OF A MOVABLE OBJECT, AND LITHOGRAPHIC APPARATUS

(71) Applicant: ASML NETHERLANDS B.V., Veldhoven (NL)

(72) Inventors: Maarten Jozef Jansen, Casteren (NL); Manoj Kumar Mridha, Eindhoven (NL); Engelbertus Antonius Fransiscus Van der Pasch, Oirschot (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/613,124

(22) PCT Filed: May 11, 2020

(86) PCT No.: PCT/EP2020/063100
§ 371 (c)(1),
(2) Date: Nov. 22, 2021

(87) PCT Pub. No.: WO2020/249339
PCT Pub. Date: Dec. 17, 2020

(65) Prior Publication Data
US 2022/0205775 A1    Jun. 30, 2022

(30) Foreign Application Priority Data

Jun. 11, 2019  (EP) .................................... 19179357
Jul. 30, 2019  (EP) .................................... 19189097

(51) Int. Cl.
*G01B 9/02002* (2022.01)
*G01B 9/02055* (2022.01)
(Continued)

(52) U.S. Cl.
CPC ....... *G01B 9/02002* (2013.01); *G01B 9/0207* (2013.01); *G01J 9/02* (2013.01); *G03F 7/70775* (2013.01); *G01B 2290/60* (2013.01)

(58) Field of Classification Search
CPC ............ G01B 9/02002; G01B 9/02004; G01B 2290/60
See application file for complete search history.

(56) References Cited

U.S. PATENT DOCUMENTS 5,106,191 A  *  4/1992  Ohtsuka .............. G01B 9/02003
                                                356/487
6,020,964 A     2/2000  Loopstra et al.
(Continued)

FOREIGN PATENT DOCUMENTS

CN    108155540    6/2018
JP    H02-27202    1/1990
(Continued)

OTHER PUBLICATIONS

Japanese Office Action issued in corresponding Japanese Patent Application No. 2021-570185, dated Nov. 28, 2022.
(Continued)

*Primary Examiner* — Michael A Lyons
(74) *Attorney, Agent, or Firm* — Pillsbury Winthrop Shaw Pittman, LLP

(57) ABSTRACT

An interferometer system including: an optical system arranged to split a radiation beam from a laser source into a first beam along a first optical path and a second beam along a second optical path, and recombine the first beam and the second beam to a recombined beam, a detector to receive the
(Continued)

recombined beam and to provide a detector signal based on the received recombined beam, and a processing unit, wherein a first optical path length of the first optical path and a second optical path length of the second optical path have an optical path length difference, and wherein the processing unit is arranged to determine a mode hop of the laser source on the basis of a phase shift in the detector signal.

15 Claims, 9 Drawing Sheets

(51) Int. Cl.
*G01J 9/02* (2006.01)
*G03F 7/20* (2006.01)
*G03F 7/00* (2006.01)

(56) References Cited

U.S. PATENT DOCUMENTS

| | | | |
|---|---|---|---|
| 6,339,471 | B1 | 1/2002 | Morita |
| 6,870,629 | B1* | 3/2005 | Vogel .................. G01M 11/331 |
| | | | 356/519 |
| 6,952,253 | B2 | 10/2005 | Lof et al. |
| 2004/0071173 | A1 | 4/2004 | Huang |
| 2005/0025198 | A1 | 2/2005 | North-Morris et al. |
| 2007/0058173 | A1 | 3/2007 | Holzapfel |
| 2008/0043227 | A1* | 2/2008 | Minneman .......... G01M 11/335 |
| | | | 356/213 |
| 2011/0304854 | A1 | 12/2011 | Li |
| 2015/0255951 | A1* | 9/2015 | Kato .................... H01S 5/06821 |
| | | | 356/508 |

FOREIGN PATENT DOCUMENTS

| | | |
|---|---|---|
| JP | H03-09202 | 1/1991 |
| JP | H05160467 | 6/1993 |
| JP | H07103828 | 4/1995 |
| JP | H08139001 | 5/1996 |
| JP | H1065265 | 3/1998 |
| JP | 2002039713 | 2/2002 |
| JP | 2002039714 | 2/2002 |
| JP | 2002243409 | 8/2002 |
| JP | 2009264929 | 11/2009 |
| JP | 2014103336 | 6/2014 |
| WO | 2018041599 | 3/2018 |
| WO | 2018171970 | 9/2018 |

OTHER PUBLICATIONS

International Search Report and Written Opinion issued in corresponding PCT Patent Application No. PCT/EP2020/063100, dated Sep. 29, 2020.

* cited by examiner

INTERFEROMETER SYSTEM, METHOD OF DETERMINING A MODE HOP OF A LASER SOURCE OF AN INTERFEROMETER SYSTEM, METHOD OF DETERMINING A POSITION OF A MOVABLE OBJECT, AND LITHOGRAPHIC APPARATUS

CROSS-REFERENCE TO RELATED APPLICATION

The application is the U.S. national phase entry of PCT Patent Application No. PCT/EP2020/063100 which was filed on May 11, 2020, which claims the benefit of priority of European Patent Application No. 19179357.9 which was filed on Jun. 11, 2019 and of European Patent Application No. 19189097.9 which was filed on Jul. 30, 2019, each of which is incorporated herein in its entirety by reference.

FIELD

The present invention relates to an interferometer system to determine a position of a movable object. The invention further relates to a method of determining a mode hop of a laser source of an interferometer system and a method of determining a position of a movable object. The invention also relates to a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In embodiments of a lithographic apparatus, interferometers are used to determine the position of movable objects with high accuracy. Examples of these movable objects are the substrate support and movable optic elements, for example mirror elements of the projection optics box.

A drawback of most known interferometers is that these interferometers are only able to determine relative displacements of the movable object with respect to a reference location. In order to determine an absolute position of the movable object with respect to the reference location a separate zeroing sensor is provided. This zeroing sensor is used to determine an absolute starting position of the movable object. Once this absolute starting position is known, the interferometer may determine a relative displacement of the movable object with respect to this absolute starting position in order to calculate an absolute position of the movable object.

The zeroing sensor is normally mounted at a specific location at which the absolute starting position of the movable object may be determined. The absolute position of the movable object may therefore only be determined when the movable object is within a relatively small measurement range of the zeroing sensor. The measurement range of the zeroing sensor is typically close to the zeroing sensor, for example within a few centimeters of the zeroing sensor. Each time the measurement of the movable object is started using the interferometer, the movable target has to be brought back into the relatively small measurement range of the zeroing sensor of the position measurement system. This may not only be the case when the lithographic apparatus is started, but for example also when the movable object is shortly out of view of the interferometer, for example when passing behind another movable object.

As an alternative for a separate zeroing sensor, a tunable laser source can be used to determine an absolute position of a movable object. Such tunable laser is constructed to provide a radiation beam with a tunable light frequency. Such laser source can be used to provide a measurement beam and a reference beam that are guided along a measurement path and a reference path, respectively, while changing the tunable light frequency of the laser source. Simultaneously, a further measurement beam and a further reference beam from a second laser source can be guided along the measurement path and the reference path. The measurement beam, the reference beam, the further measurement beam and the further reference beam can be measured by a number of detectors in order to determine a first measurement phase value based on the measurement beam, a second measurement phase value based on the further measurement beam, a first reference phase value based on the reference beam and a second reference phase value based on the further reference beam. The absolute position of the movable object may be determined on the basis of the first measurement phase value, the second measurement phase value, the first reference phase value and the second reference phase value.

Laser sources, for example the tunable laser source, may be susceptible for a mode hop, a sudden shift in laser frequency for instance in the order of a few GHz. Mode hops may be caused by temperature or current variations or by external influences such as vibrations of the laser source. For example, in grating based tunable laser sources the mode hop may be caused by mechanically induced vibrations in the wavelength tuning element.

The occurrence of a mode hop may have a negative effect on the accuracy of the measurement of a positon of the movable object, for example the measurement of an absolute position of the movable object using a combination of a fixed frequency laser source and a tunable laser source.

SUMMARY

It is an object of a first aspect of the invention to provide an interferometer system constructed to determine a mode hop of a laser source of the interferometer system, such that such mode hop can be taken into account in position measurements of the interferometer system. It is another object of the first aspect of the invention to provide a method of determining a position of a movable object using an interferometer system, in which the effect of a mode hop of a laser source of the interferometer system is taken into account.

According to an embodiment of a first aspect of the invention, there is provided an interferometer system to determine a position of a movable object, comprising:

a laser source to provide a radiation beam, an optical system arranged to split the radiation beam into a first beam along a first optical path and a second beam along a second optical path, wherein the optical system is arranged to recombine the first beam and the second beam to a recombined beam, a detector to receive the recombined beam and to provide a detector signal on the basis of the received recombined beam, and a processing unit to process the detector signal, wherein a first optical path length of the first optical path and a second optical path length of the second optical path have an optical path length difference, wherein the processing unit is arranged to determine a mode hop of the laser source on the basis of a phase shift in the detector signal resulting from such mode hop.

According to an embodiment of a first aspect of the invention, there is provided a method of determining a mode hop of a laser source of an interferometer system, comprising:

emitting a radiation beam from the laser source, splitting the radiation beam into a first beam which is guided along a first optical path and a second beam which is guided along a second optical path, wherein a first optical path length of the first optical path and a second optical path length of the second optical path have an optical path length difference, recombining the first beam and the second beam into a recombined beam, providing a detector signal on the basis of the recombined beam, and processing the detector signal to determine the mode hop of the laser source on the basis of a phase shift in the detector signal resulting from such mode hop.

According to an embodiment of a first aspect of the invention, there is provided a method of determining a position of a movable object using the interferometer system of any of the claims 1-13, comprising the steps of:

measuring a position of the movable object, determining whether a mode hop of the laser source of the interferometer system occurred during measuring of the position of the movable object, if no mode hop occurred, using the measured position, and if a mode hop occurred, ignoring the measurement results associated with the mode hop and/or repeating the steps of measuring the position of the movable object and determining whether a mode hop occurred during measuring.

According to an embodiment of a first aspect of the invention, there is provided a lithographic apparatus comprising a mask support constructed to support a patterning device having a pattern, a substrate support constructed to support a substrate;

a projection system arranged to project the pattern onto the substrate; and wherein one of the mask support, the substrate support and the projection system comprises a movable object, wherein the lithographic apparatus further comprises an interferometer system as claimed in any of the claims 1-13 to determine the position of the movable object.

According to an embodiment of a first aspect of the invention, there is provided a lithographic apparatus comprising a mask support constructed to support a patterning device having a pattern, a substrate support constructed to support a substrate having a marker;

a projection system arranged to project the pattern onto the substrate;

an alignment system arranged to measure a position of the marker; and an interferometer system as claimed in any of the claims 1-13, wherein the recombined beam is used as a measurement beam and the detector is a measurement detector, wherein the measurement beam is reflected on a reflective measurement surface arranged or connected to the projection system or the alignment system before being received by the measurement detector.

In a known embodiment of an interferometer system used in a lithographic apparatus a single pass principle is used, i.e. the light emitted by a probe head is one time reflected by a retroreflector mounted on the object of interest, i.e. an object of which a displacement is to be measured, and received by the probe head for further processing. In such interferometer system a relatively small retroreflector and a relatively small probe head can be applied. But the single pass principle is typically susceptible for a lateral shift of the retroreflector mounted on the object of interest with respect to the optical path of the measurement beam in a direction perpendicular to the optical path. A lateral shift of more than half the beam diameter of the measurement beam, may result in no light being returned to the probe head.

In an alternative embodiment of an interferometer system, a double pass principle is used. In the double pass principle, the measurement beam emitted by the probe head is reflected twice by the retroreflector. Between the two reflections, the light is reflected by another object not mounted on the object of interest, for example by a reflective surface of the probe head. In order to compensate for lateral shifts of the retroreflector in a direction perpendicular to the optical path of the measurement beam reflected by the retroreflector, a larger retroreflector can be mounted on the object of interest. Also a relatively large probe head to cooperate with retroreflector may have to be provided.

In some applications, it is desirable that the retroreflector can be small and lightweight, while at the same time allowing a relatively large shift of the retroreflector with respect to the optical path in a direction perpendicular to the optical path. For example, in a lithographic apparatus, a cooling hood may be provided, the position of which may be measured using an interferometer system. However, there is little space available for mounting a retroreflector and probe head. Furthermore, there may occur some lateral shift. This lateral shift should not negatively affect the measurement accuracy of the interferometer system in the measurement direction.

It is an object of a second aspect of the invention to provide an interferometer system having an improved or at least alternative construction that allows to construct a probe head that can cooperate with a relatively small retroreflector mounted on the object of interest. Furthermore, it is desirable that the probe head may have small dimensions and/or that the interferometer system is less susceptible to lateral shift of the retroreflector with respect to the optical path of the measurement beam of the interferometer system. Also, it is desirable to provide an interferometer system with sufficient measurement resolution.

According to an embodiment of a second aspect of the invention, there is provided an interferometer system to determine a displacement of an object of interest, comprising:

a light source to provide a radiation beam, an optical system arranged to split the radiation beam into a measurement beam along a first optical path and a reference beam along a second optical path, wherein the optical system is arranged to recombine the measurement beam and the reference beam to a recombined beam, a detector to receive the recombined beam and to provide a detector signal on the basis of the received recombined beam, a processing unit to process the detector signal, an optical input fiber to guide the radiation beam from the light source to the optical system, and an optical output fiber to guide the recombined beam from the optical system to the detector wherein the optical input fiber and the optical output fiber are different fibers.

According to an embodiment of a second aspect of the invention, there is provided a lithographic apparatus comprising:

a mask support constructed to support a patterning device having a pattern, a substrate support constructed to support a substrate;

a projection system arranged to project the pattern onto the substrate; and wherein one of the mask support, the substrate support and the projection system comprises an object of interest, wherein the lithographic apparatus further comprises an interferometer system as described herein to determine the position of the object of interest.

According to an embodiment of a second aspect of the invention, there is provided a lithographic apparatus, comprising:

a mask support constructed to support a patterning device having a pattern, a substrate support constructed to support a substrate having a marker;

a projection system arranged to project the pattern onto the substrate;

a cooling hood to provide cooling; and an interferometer system as described herein to determine a position of the cooling hood.

BRIEF DESCRIPTION OF THE DRAWINGS

Embodiments of the first and second aspect of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
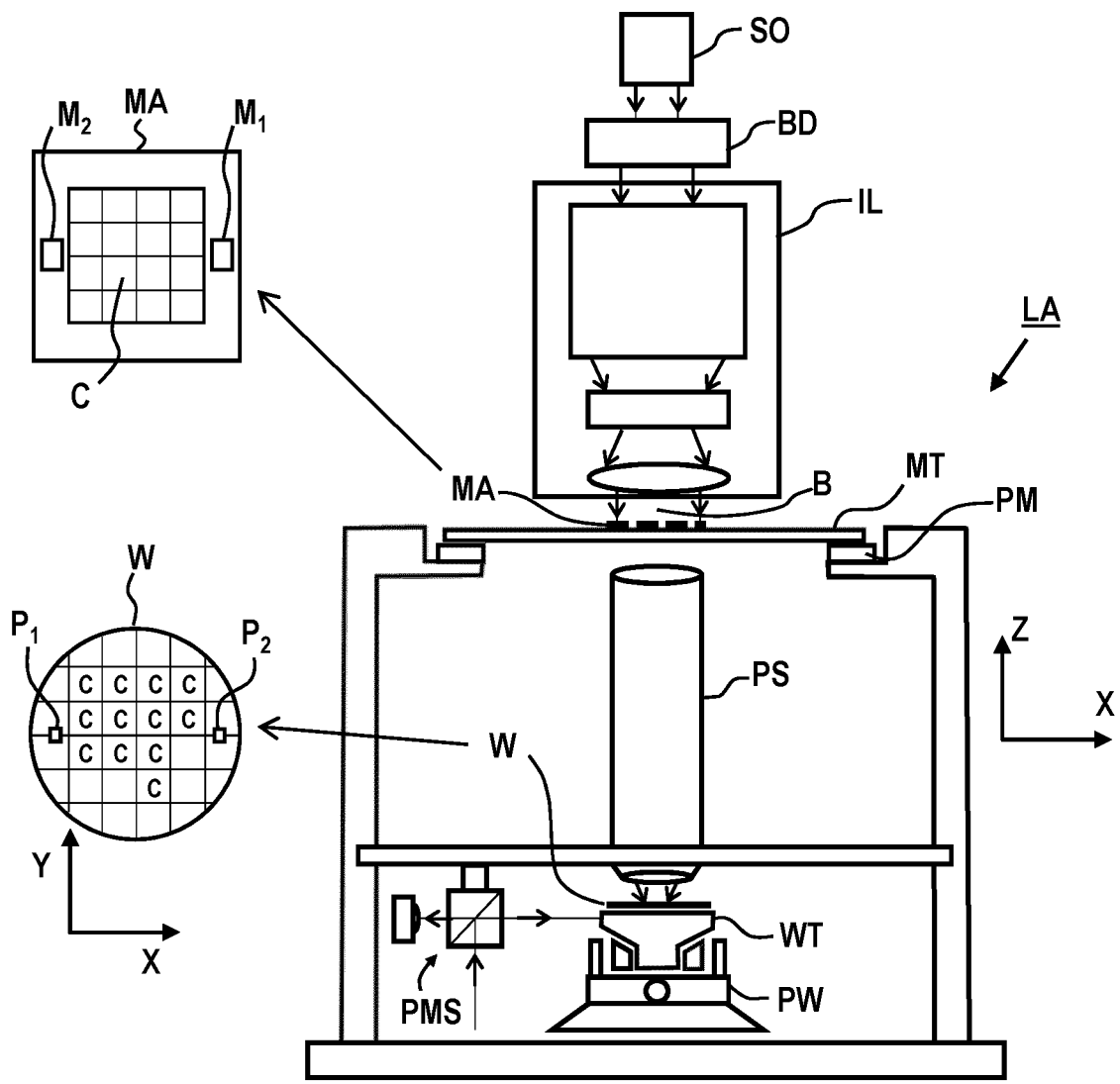
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
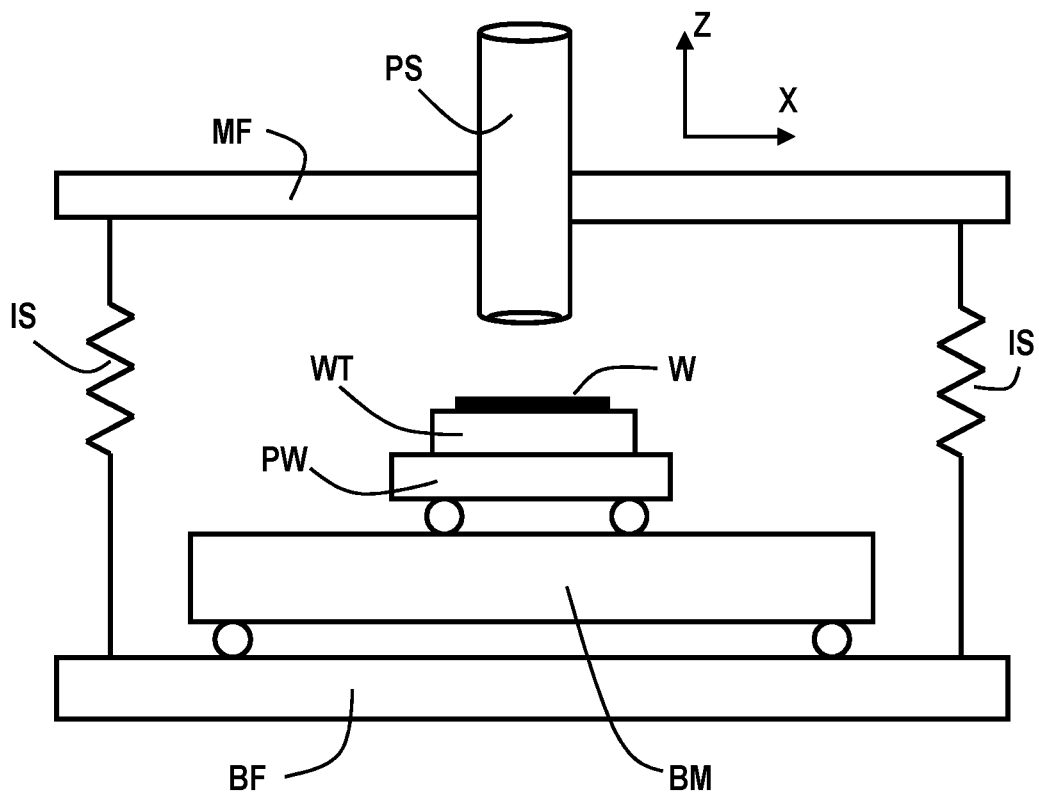
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
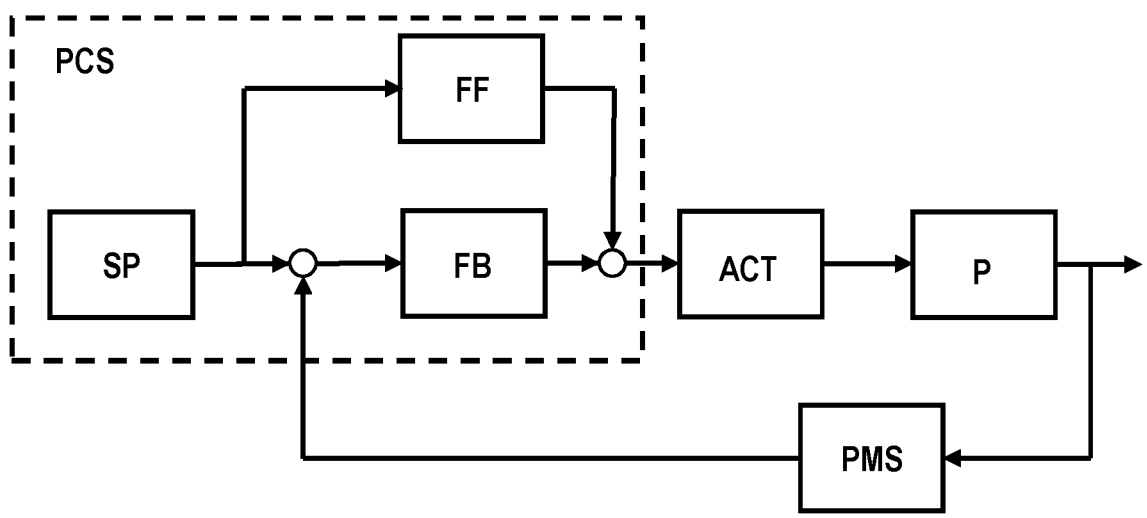
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
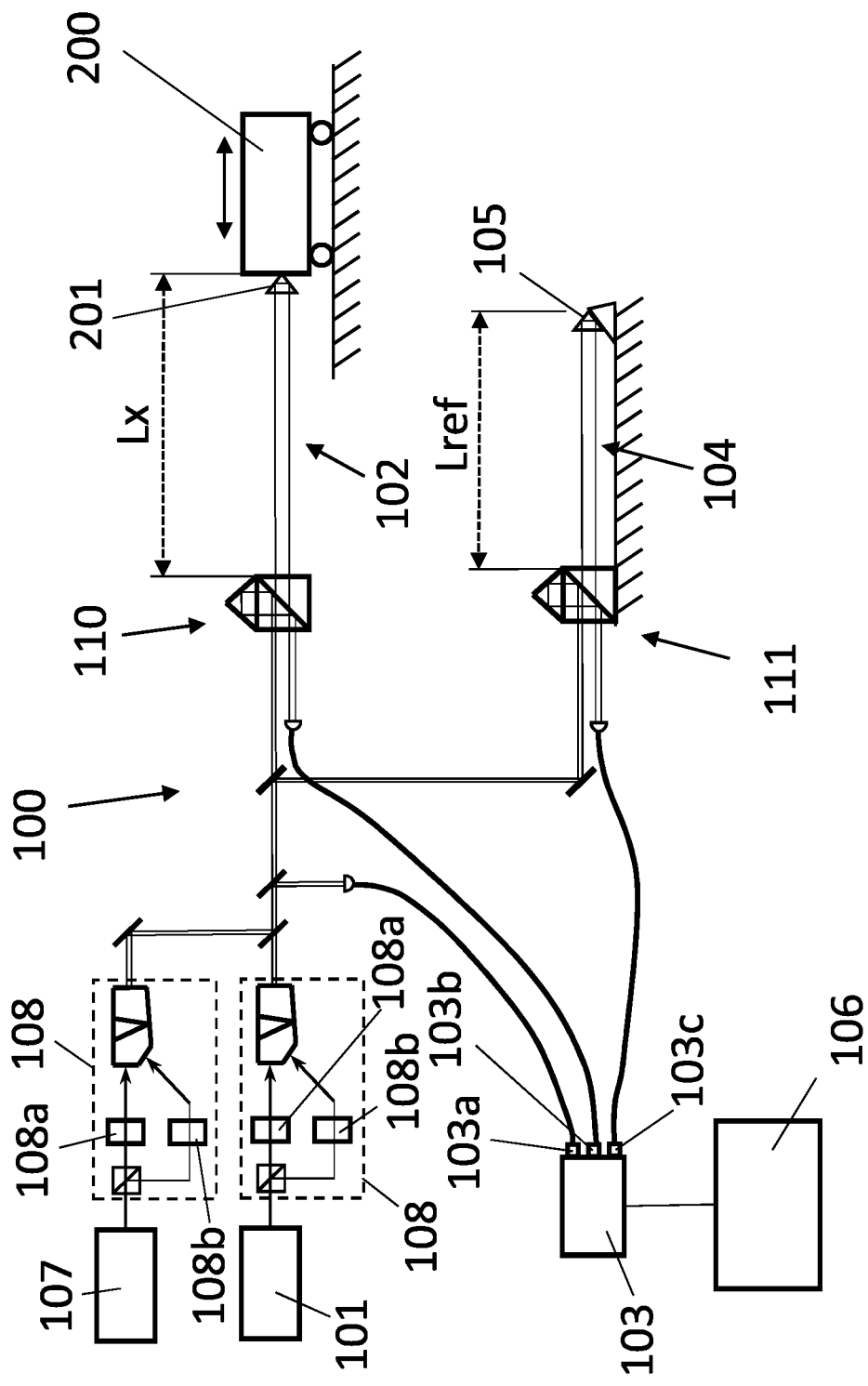
FIG. 4 schematically depicts an embodiment of an interferometer system according to an embodiment of a first aspect of the invention.

FIG. 4 shows an embodiment of an interferometer system 100 according to an embodiment of the invention. The interferometer system 100 is arranged to determine an absolute position of a movable object 200, for example a movable part of a projection system PS of a lithographic apparatus. The movable object 200 may also be a mask support or a substrate support of a lithographic apparatus. The movable object 200 comprises a reflective measurement surface 201.

The interferometer system 100 is a heterodyne interferometer system comprising a fixed frequency laser source 101. The fixed frequency laser source 101 is constructed to provide a radiation beam with a fixed frequency, and is for example a stabilized HeNe laser source.

The interferometer system 100 further comprises a tunable laser source 107. The tunable laser source 107 is configured to provide a radiation beam with a tunable light frequency.

The interferometer system 100 comprises optical systems 108 associated with each of the fixed frequency laser source 101 and the tunable laser source 107. The optical systems 108 are each constructed to split the respective radiation beam into a first beam which is guided along a first optical path and a second beam which is guided along a second optical path.

In each optical system 108, a first optical frequency shift device 108a is provided in the first optical path and a second optical frequency shift device 108b is provided in the second optical path in order to create a frequency difference between a first frequency of the first beam and a second frequency of the second beam. The first optical frequency shift device 108a and the second optical frequency shift device 108b are for example acousto-optical modulator units that effectively create a frequency difference of for example 4 MHz between the first frequency of the first beam and the second frequency of the second beam. Other devices to create a frequency difference between the first beam and the second beam may also be applied. It is also possible that only in the first optical path or in the second optical path a frequency shift device is arranged to create the desired frequency difference between the first frequency of the first beam and the second frequency of the second beam. The first beam and the second beam originating from the fixed frequency laser source 101 are recombined in the optical system 108 in a recombined radiation with a fixed light frequency. Correspondingly, the first beam and the second beam originating from the tunable laser source 107 are recombined in the optical system 108 in a recombined radiation with a tunable light frequency.

The recombined radiation beam with fixed light frequency is split, for example by a non-polarizing beam splitter, into a first part and a second part. The first part is directed to interferometer optics 110. The interferometer optics 110 are arranged to split the first part into a first measurement beam and a first reference beam. The first measurement beam is guided along a measurement path 102, having a measurement path length $L_x$, to the reflective measurement surface 201 on the movable object 200. After the first measurement beam is reflected by the reflective measurement surface 201, the first measurement beam is recombined with the first reference beam in the interferometer optics 110. The recombined first measurement beam and first reference beam are directed to a detector 103b which is connected to a light sensor device 103. The second part of the laser beam is directed to interferometer optics 111. The interferometer optics 111 is arranged to split the second part into a second measurement beam and a second reference beam. The second measurement beam is guided along a reference path 104, having a reference path length $L_{ref}$, to a reflective reference surface 105. After the second measurement beam is reflected by the reflective reference surface 105, the second measurement beam is recombined with the second reference beam in the interferometer optics 111. The recombined second measurement beam and second reference beam are directed to a detector 103c which is connected to the light sensor 103.

Part of the recombined radiation beam with fixed light frequency is directed to a reference detector 103a which is connected to the light sensor device 103. This part of the recombined radiation beam with fixed light frequency has not interacted with the reflective measurement surface 201 or the reflective reference surface 105.

The reflective reference surface 105 is arranged at a fixed location that is used as reference location for measurements. The construction in which the reflective reference surface 105 is provided is therefore intended to be inherently stable, i.e. the location of the reflective reference surface 105 with respect to the interferometer system 100 is constant. The length $L_{ref}$ of the reference path 104 is therefore also a constant length.

The reference detector 103a propagates the part of the laser beam onto a light diode of the light sensor device 103. The detector 103b propagates the recombined first measurement beam and first reference beam onto another light diode of the light sensor device 103. The detector 103c propagates the recombined second measurement beam and second reference beam onto yet another light diode of light sensor device 103. The measurements of the light diodes are fed via the light sensor device 103 into a processing unit 106. The processing unit 106 generates a first measurement phase value $ph1_x$ based on the input by the detector 103b. Alternatively, the processing unit 106 may generate the first measurement phase value $ph1_x$ based on the input by the detector 103b and the input by the reference detector 103a to compensate for disturbances of the laser beam between the fixed frequency laser source 101 and the interferometer optics 110. The processing unit 106 generates a first reference phase value $ph1_{ref}$ based on the input by the detector 103c. Alternatively, the processing unit 106 may generate the first reference phase value $ph1_{ref}$ based on the input by the detector 103c and the input by the reference detector 103a to compensate for disturbances of the laser beam between fixed frequency laser source 101 and the interferometer optics 111. The first measurement phase value $ph1_x$ represents a distance or displacement of the measurement object 200, i.e., the measurement path length $L_x$. The first reference phase value $ph1_{ref}$ represents the reference path length $L_{ref}$, which is a constant length.

The recombined radiation beam with tunable light frequency is split in a further first part and a further second part. Similar to the first part, the further first part is directed to interferometer optics 110. The interferometer optics 110 are arranged to split the further first part into a further first measurement beam and a further first reference beam. The further first measurement beam is guided along the measurement path 102, having the measurement path length $L_x$, to the reflective measurement surface 201 on the movable object 200. After the further first measurement beam is reflected by the reflective measurement surface 201, the further first measurement beam is recombined with the further first reference beam in the interferometer optics 110. The recombined further first measurement beam and further first reference beam are directed to the detector 103b which is connected to the light sensor device 103. The further second part is directed to interferometer optics 111. The interferometer optics 111 are arranged to split the further second part into a further second measurement beam and a further second reference beam. The further second measurement beam is guided along the reference path 104, having the reference path length $L_{ref}$, to the reflective reference surface 105. After the further second measurement beam is reflected by the reflective reference surface 105, the further second measurement beam is recombined with the further second reference beam in the interferometer optics 111. The recombined further second measurement beam and the further second reference beam are directed to the detector 103c which is connected to the light sensor device 103.

Part of the recombined radiation beam with tunable light frequency is directed to the reference detector 103a which is connected to the light sensor device 103. This part of the recombined radiation beam with tunable light frequency has not interacted with the reflective measurement surface 201 or the reflective reference surface 105.

The reference detector 103a propagates the part of the recombined radiation beam with tunable light frequency onto a light diode of the light sensor device 103. The detector 103b propagates the recombined further first measurement beam and further first reference beam onto another light diode of the light sensor device 103. The detector 103c propagates the recombined further second measurement beam and further second reference beam onto yet another light diode of light sensor device 103. The measurements of the light diodes are fed via the light sensor device 103 into the processing unit 106. The processing unit 106 generates a second measurement phase value ph2$_x$ based on the input by the detector 103b. Alternatively, the processing unit 106 may generate the second measurement phase value ph2$_x$ based on the input by the detector 103b and the input by the reference detector 103a to compensate for disturbances of the second laser beam between the tunable laser source 107 and the interferometer optics 110. The processing unit 106 generates a second reference phase value ph2$_{ref}$ based on the input by the detector 103c. Alternatively, the processing unit 106 may generate the second reference phase value ph2$_{ref}$ based on the input by the detector 103c and the input by the reference detector 103a to compensate for disturbances of the second laser beam between the tunable laser source 107 and the interferometer optics 111. The second measurement phase value ph2$_x$ represents a distance or displacement of the measurement object 200, i.e., the measurement path length L$_x$. The second reference phase value ph2$_{ref}$ represents the reference path length L$_{ref}$, which is a constant length.

The processing unit 106 is arranged to distinguish the first measurement phase value ph1$_x$, the first reference phase value ph1$_{ref}$, the second measurement phase value ph2$_x$, and the second reference phase value ph2$_{ref}$. The first measurement phase value ph1$_x$ changes due to movements of the moveable object 200. The second measurement phase value ph2$_x$ changes due to movements of the movable object 200 and due to a change in the tunable light frequency of the second laser beam. Since the fixed frequency laser source 101 provides a laser beam with a fixed light frequency, the first measurement phase value ph1$_x$ is representative for the displacement of the movable object 200, while the second measurement phase value ph2$_x$ may be representative for displacements of the movable object 200, and also for frequency changes, i.e. wavelength variations, of the light of the tunable laser source 107.

During measurements with the light sensor device 103, the first measurement phase value ph1$_x$, the second measurement phase value ph2$_x$, the first reference phase value ph1$_{ref}$, and the second reference phase value ph2$_{ref}$ may be measured. A combination of the four measured phase values at a single point in time are indicated, in this application, as a data point. Thus, a data point comprises, for a specific point in time, the first measurement phase value ph1$_x$, the second measurement phase value ph2$_x$, the first reference phase value ph1$_{ref}$, and the second reference phase value ph2$_{ref}$.

Assuming that the movable object 200 will remain at a stationary location during measurement, and the tunable light frequency of the tunable laser source 107 is changed over time, a length ratio L$_{rat}$ between the measurement path length L$_x$ and the reference path length L$_{ref}$ can be determined by the processing unit 106 on the basis of the change of the second measurement phase value ph2$_x$ and the second reference phase value ph2$_{ref}$ over time, as caused by the change in the tunable light frequency of radiation beam of the tunable laser source 107, as:

$$L_{rat}=L_x/L_{ref}=\Delta ph2_x/\Delta ph2_{ref}$$

Since the length of the reference path L$_{ref}$ is constant and known, the absolute position of the movable object 200 can consequently be determined as follows: L$_x$=L$_{rat}$*L$_{ref}$.

Thus, the frequency change of the tunable laser source 107 provides sufficient data to calculate the absolute position of the movable object 200 if the movable object 200 remains in a stationary location. However, in practice, the movable object 200 will normally not remain sufficiently stationary to determine the absolute position in this way. The movable object 200 may for instance make a vibrating movement caused by external influences.

By selection of data points according to a selection criterion movement of the movable object 200 may be compensated when determining an absolute position of the movable object 200. By compensation of the movement of the movable object 200, the absolute position of the movable object 200 can be determined by the interferometer system 100 itself, i.e. without the need of additional zeroing sensors.

Since the radiation beam with fixed light frequency allows to determine any relative displacement of the movable object 200, it can be determined whether the movable object 200 is moved during the measurement of the first measurement phase value ph1$_x$ and the second measurement phase value ph2$_x$. In an embodiment of such method data points are selected from all collected data points for which a relative position of the movable object 200, as measured with the radiation beam of the fixed frequency laser source 101, is the same. According to this method, all data points that are collected by measurements with the interferometer system 100 are compared. Data points for which the first measurement phase value ph1$_x$ are the same are selected to form a set of data points. This set of data points resembles a measurement sequence in which the movable object 200 is on the same position at each data point, so it looks as if the movable object 200 has not moved.

Figure 5:
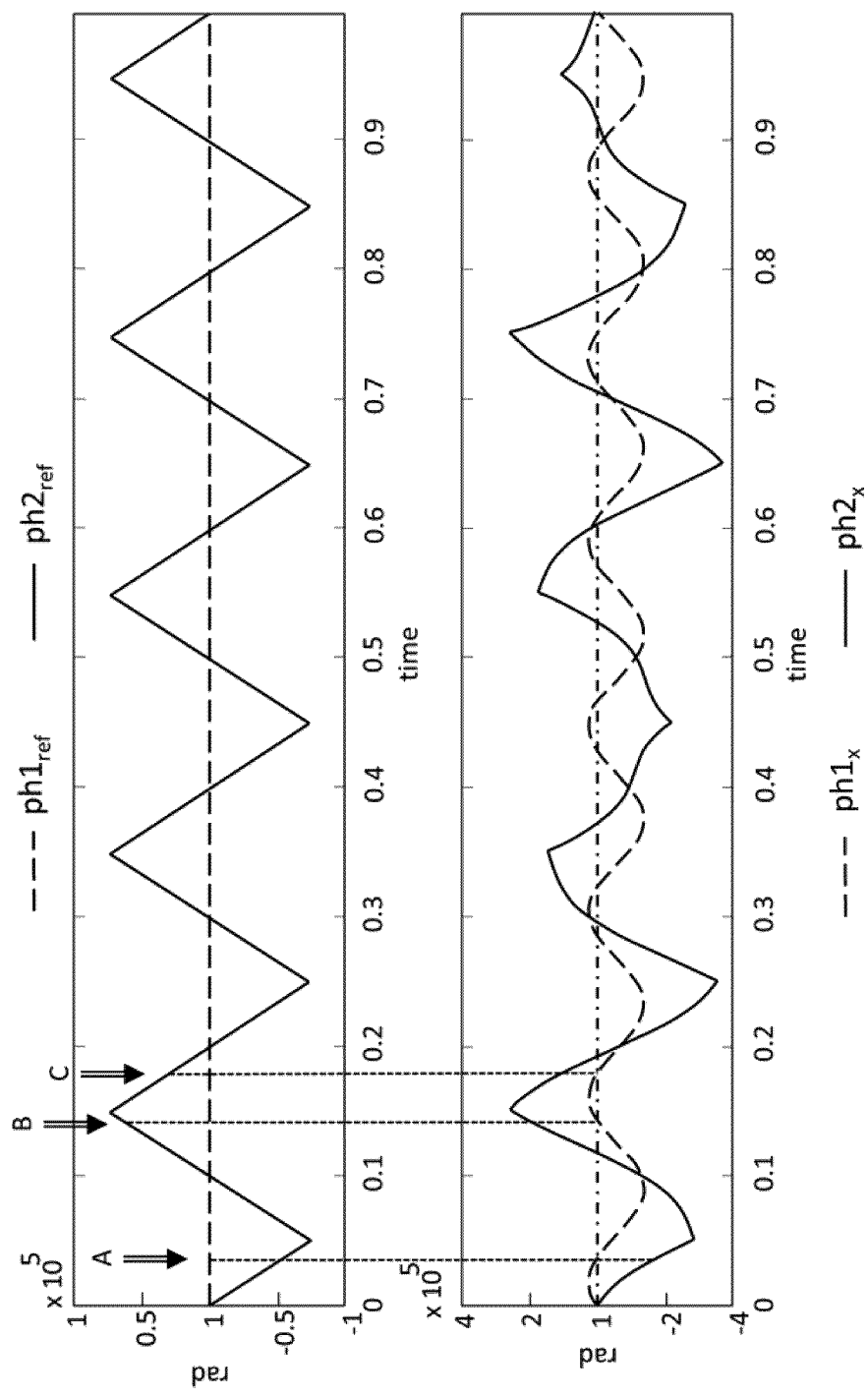
FIG. 5 shows selection of a set of data points according to a selection criterion.

This selection of data points is now explained in more detail with reference to FIG. 5. The upper part of FIG. 5 shows the first reference phase value ph1$_{ref}$ and the second reference phase value ph2$_{ref}$ over time. It can be seen that the constant wavelength of the light of the fixed frequency laser source 101 results in a constant value of the first reference phase value ph1$_{ref}$. The modulated wavelength change over time of the light as provided by the tunable laser source 107 results in a modulating value of the second reference phase value ph2$_{ref}$. In the lower part of FIG. 5, the first measurement phase value ph1$_x$ and the second measurement phase value ph2$_x$ over time are depicted. From the course of the first phase value ph1$_x$, it can be seen that the movable object 200 makes back and forth movements in a position range, for example a vibrating movement. The second measurement phase value ph2$_x$ shows the additional effect of the modulating frequency of the radiation beam of the tunable laser source 107.

To determine an absolute position of the movable object 200, a plurality of data points having the same first measurement phase value ph1$_x$ are selected to form a set of data points. At least 2 data points are required, but having more than 2 data points helps to determine the absolute position more accurately. In FIG. 5, as an example, three data points A, B and C are indicated that each have a first measurement phase value ph1$_x$ equal to zero. These data points A, B and C can be used as a set of data points. In practice, the set of data points may comprise many more data points. Instead of zero, any other value of the first measurement phase value $ph1_x$ can also be selected as long as for each data point within the set of data points the first measurement phase value $ph1_x$ is equal. It is advantageous to select a value that is available in many data points.

For such set of data points, an absolute position of the movable object 200 can be determined as described above, i.e. the length ratio $L_{rat}$ can be determined on the basis of the second measurement phase value $ph2_x$ and the second reference phase value $ph2_{ref}$. When the length ratio $L_{rat}$ is calculated, the absolute position of the movable object 200 can be calculated from the length ratio $L_{rat}$ and the known length of the reference path 104.

Other methods to determine the absolute position of the movable object 200 on the basis of the data points may also be applied.

In the tunable laser source 107 a laser diode may be used to provide the radiation beam with tunable light frequency. Such laser diode may be susceptible to mode hops. Mode hops have the effect of sudden frequency changes in the radiation beam, for example in the order of a few GHz. Mode hops may be caused by temperature or current variations or by external influences such as vibrations of the laser source 107. In grating based tunable laser sources the mode hop may also be caused by mechanically induced vibrations in the wavelength tuning element.

Figure 6:
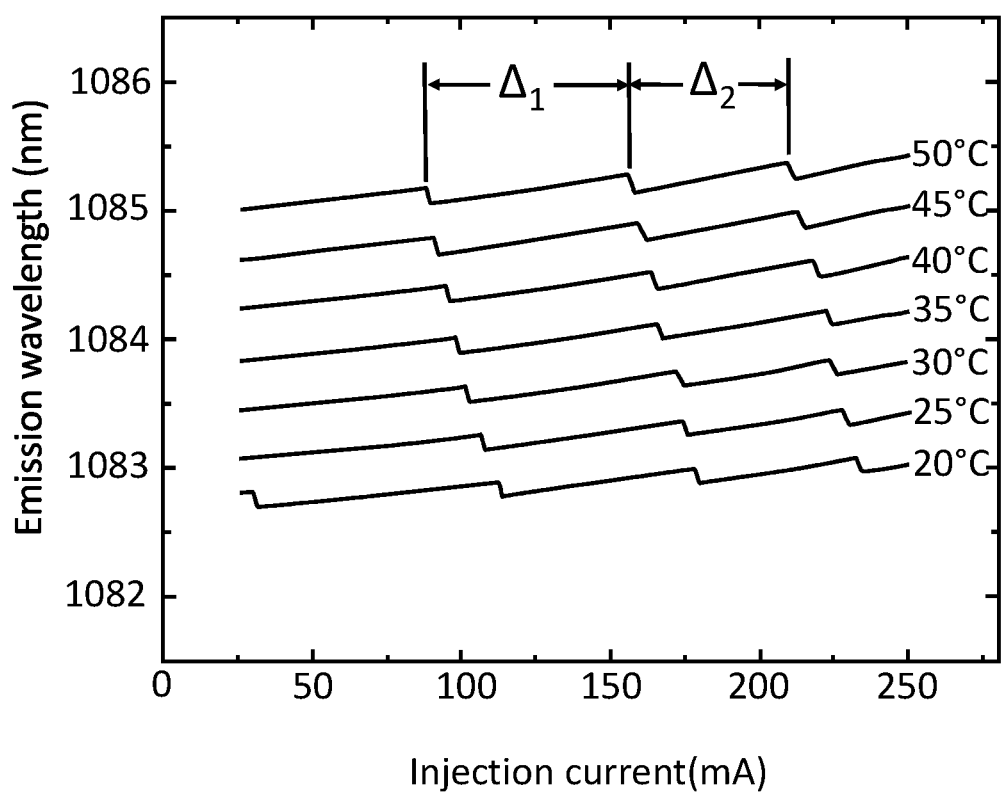
FIG. 6 shows an example of mode hop of a laser source.

FIG. 6 shows an example of the occurrence of mode hops in a diagram showing the relationship between wavelength and injection current for specific laser temperatures. In each line showing this relationship sudden changes in the wavelength of the emitted radiation beam can be found with increasing injection current for the laser source. These sudden changes in the wavelength are thus referred to as mode hops.

The occurrence of a mode hop when determining an absolute position of a movable object 200, for example using the method as explained above, may have the result that the absolute position of the movable object 200 is determined incorrectly. Therefore, it is desirable that the occurrence of a mode hop can be detected.

The interferometer system 100 shown in FIG. 4 is configured to determine a mode hop. In the optical system 108, the first optical path along which the first beam is guided and the second optical path along which the second beam is guided have a different optical path length. Thus, there is an optical path length difference between the first optical path and the second optical path. As a result of this optical path length difference, a mode hop of the wavelength emitted by the tunable laser source will result in a phase shift in the recombined radiation beam with tunable wavelength. This phase shift can be detected by the interferometer system, as long as the phase shift is not equal to $k*2\pi$, wherein k is an integer. Since the expected frequency change due to a mode hop is can be estimated/determined for a specific laser source, the optical path difference can be selected such that the phase shift resulting from the mode hop is not equal to $k*2\pi$. The magnitude of the phase shift due to a mode hop is $2\pi*OPD*\Delta f/c$ rad, wherein OPD is the optical path length difference, $\Delta f$ the frequency change due to a mode hop and c the speed of light. As a result, when the OPD is not equal to $k*c/\Delta f$, the phase shift resulting from the phase shift will also not be equal to $k*2\pi$.

The optical path difference is therefore advantageously selected such that a phase shift resulting from a mode hop is $(r+k)*c/\Delta f$, wherein r is in the range 0.1 to 0.9, for example 0.3 to 0.7, such as about 0.5, k is an integer, c is the speed of light and $\Delta f$ is the frequency change due to a mode hop.

In such embodiment, it is advantageous that k is relatively small, for example k=0 or 1 or 2. This means that the optical path length difference is relatively small.

In the interferometer system 100, the reference detector 103a of the interferometer system 100 can advantageously be used to detect a mode hop. Since the optical path of the interferometer system 100 from the respective optical system 108 to the reference detector 103a does not add any additional optical path length difference between the first beam and the second beam other than the optical path length difference introduced in the optical system 108, the optical path length difference to the reference detector 103a is relatively small. This optical path length difference may for example be in the range of 15 mm to 135 mm.

In an embodiment, in which the optical path length difference of the optical system 108 is 0.046 m and a frequency shift $\Delta f$ of the mode hop is 2 Ghz, the phase shift that may be detected by the reference detector 103a is approximately $0.3*2\pi$, i.e. 0.3 fringes.

In the optical paths towards the detector 103b and the detector 103c, further optical path length differences are added by the difference in optical paths between the measurement beam and reference beam and the further measurement beam and the further reference beam. In an embodiment, the total optical path length difference towards the detector 103b may for example be 6 to 7.5 m and the total optical path length difference towards the detector 103c may for example be about 2.5 m. For these larger optical path length differences, it may be more difficult to detect a mode hop as the phase signals and the derivatives thereof are more influenced by other frequency variations, such as frequency noise and intended frequency tuning.

Moreover, the optical path length difference towards detector 103b may also change due to movements of the movable object 200. As a result, the optical path length difference may also coincide with $k*c/\Delta f$, causing a phase shift in the detector signal due to a mode hop of close to $k*2\pi$, which may be undetectable.

Therefore, it is advantageous to use the optical path to the reference detector 103a to detect the occurrence of a mode hop. This has the additional advantage that the optical path to the reference detector 103a is stable.

Figure 7A:
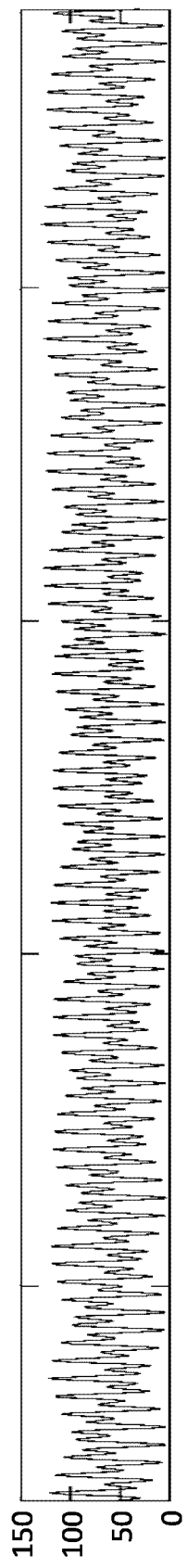
FIGS. 7a, 7b and 7c show diagrams showing phase signals processed from the detector signal received by the reference detector.
Figure 7B:
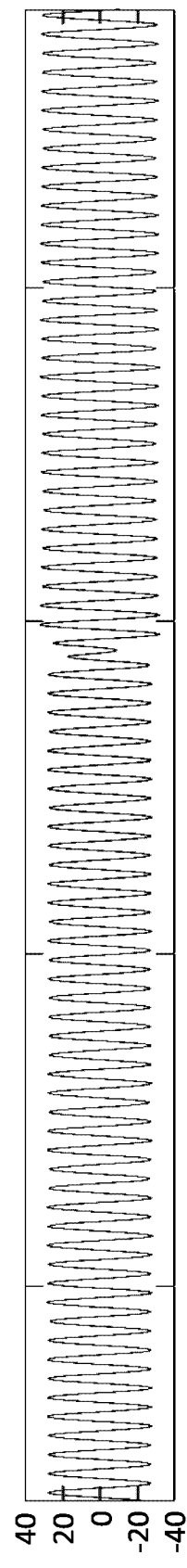
Figure 7C:
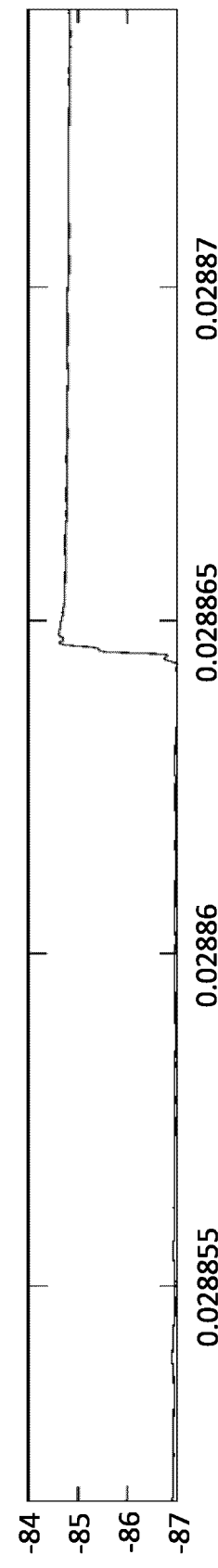

FIGS. 7a, 7b and 7c show graphs with (processed) signals on the basis of the optical signal received by the reference detector 103a.

FIG. 7a shows a mixed signal combining the recombined radiation beam with fixed light frequency of the fixed frequency laser source 101 and the recombined radiation beam with tunable light frequency of the tunable laser source 107.

FIG. 7b shows only the signal of the recombined radiation beam with tunable light frequency of the tunable laser source 107. In this graph the occurrence of a mode hop can be detected as indicated by an arrow.

FIG. 7c shows an unwrapped phase of the recombined radiation beam with tunable light frequency of the tunable laser source 107, i.e. the phase of an ideal carrier frequency as introduced by the frequency shift devices 108a and 108b is removed from the signal shown in FIG. 7b, resulting in the shown unwrapped signal. In this graph, the effect of the mode hop, as indicated by an arrow can even more easily be distinguished. In practice, it may even be more convenient to observe changes in a derivative of the phase shift in the detector signal in order to determine the mode hop of the tunable laser source 107.

Once the occurrence of a mode hop is detected, it can be concluded that the absolute position that may be determined on the basis of the associated data points may be inaccurate. Therefore, during collecting data points for the determination of an absolute position of the movable object 200, the occurrence of a mode hop may be observed. If no mode hop occurs, the data points are reliable and can be used to determine an absolute position of the movable object 200. If during collecting the data points a mode hop has been determined, the data points associated with the mode hop are not reliable. It should be avoided to use these data points for the determination of an absolute position of the movable object 200.

In a first method, the data points associated with the mode hop may be ignored, for example when sufficient other, reliable data points are available. In another method, the steps of measuring the absolute position of the movable object 200 may be repeated, while again the occurrence of mode hops during these repeated measurement steps is observed. When the mode hops keep occurring during the repeated collecting of data points, different settings of the tunable laser source 107 may be used. As an alternative, an alternative laser source, if available, may be used to carry out the collecting of data points.

Hereinabove, mode hop detection is described in order to determine a mode hop of a tunable laser source 107 which is used to determine an absolute position of the movable object 200 in a heterodyne interferometer system. Mode hop detection as described in this application may also be applied in any other interferometer system in which a difference in optical path length between a first beam and a second beam can be used to determine a phase shift caused by the frequency shift of the mode hop. Mode hops that occur with both tunable laser sources and fixed frequency laser sources may be determined by the mode hop detection as described in this application.

Figure 8:
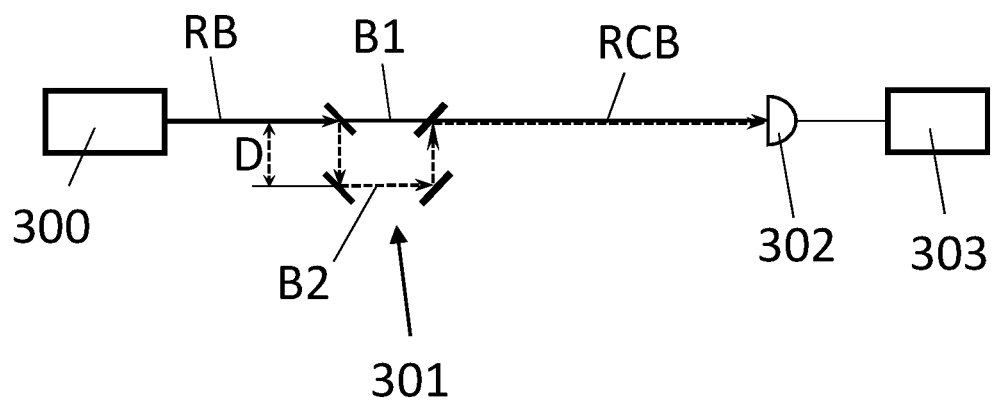
FIG. 8 shows schematically a single optical axis of an embodiment of an interferometer system according to a first aspect of the invention.

FIG. 8 shows schematically an interferometer axis depicting the optical path between a laser source 300 and a detector 302. In the optical path an optical system 301 is provided. The optical system 301 is arranged to split the radiation beam RB of the laser source 300 into a first beam B1 guided along a first optical path and a second beam B2 guided along a second optical path, wherein the optical system 108 is arranged to recombine the first beam B1 and the second beam B2 to a recombined beam RCB. The detector 302 is arranged to receive the recombined beam RCB and to provide a detector signal on the basis of the received recombined beam RCB. A processing unit 303 is provided to process the detector signal. The radiation beam RB may have a wavelength of about 633 nm.

The first optical path length of the first optical path and the second optical path length of the second optical path have an optical path length difference of 2*D. As a result of this optical path length difference of 2*D, the processing unit 303 may determine a mode hop of the laser source 300 on the basis of a phase shift in the detector signal resulting from such mode hop, as long as the phase shift resulting from the mode hop is not equal to k*2π, wherein k is an integer. This can be avoided by proper selection of the optical path length difference between the first optical path and the second optical path, wherein the optical path length difference is selected to be $(r+k)*c/\Delta f$, wherein r is in the range 0.1 to 0.9, for example 0.3 to 0.7, such as about 0.5, k is an integer, c is the speed of light and $\Delta f$ is the frequency change due to a mode hop.

Generally the detection of the occurrence of mode hops may be improved by creating a relatively small optical path length difference, for example an optical path length difference of less than $4*c/\Delta f$.

Further, the optical path length difference may be created at any location or combination of locations in the optical path between the laser source 300 and the detector 302, and is therefore, not limited to a specific location of the optical system 301. Any optical element that creates an optical path length difference between a first beam and a second beam originating from a radiation beam of the laser source 300 may be regarded as a part of the optical system 301.

Instead of using a single interferometer axis having a recombined beam combining a first beam and a second beam having an optical path length difference, also two interferometer axes can be used. In such configuration, each interferometer axis should have at least one radiation beam, wherein the optical length of the two interferometer axes should be different in order to determine the effect of a mode hop. The optical path length difference between any two interferometer axes should not be equal to $k \cdot c/\Delta f$, such that the mode-hop induced frequency change introduces a change in the phase difference between two interferometers unequal to k*2π, wherein k is an integer, and the optical path length difference may advantageously be short, for example smaller than $5*c/\Delta f$.

Figure 9:
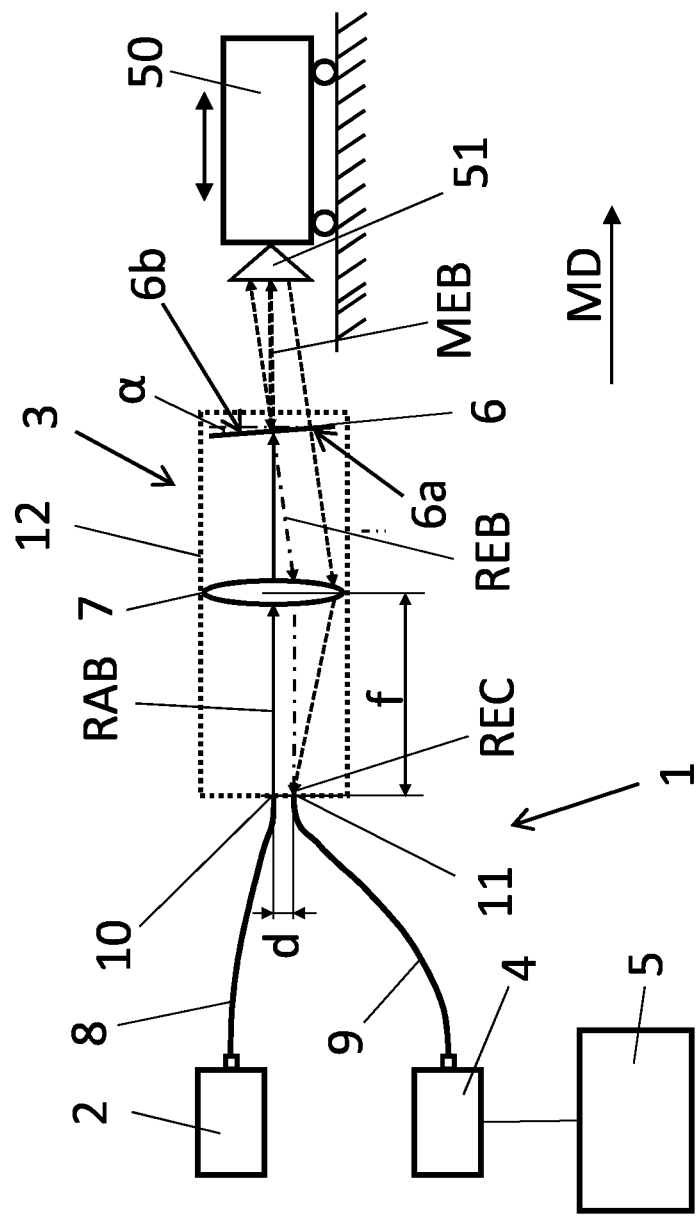
FIG. 9 shows schematically a first embodiment of an interferometer system according to a second aspect of the invention.

FIG. 9 shows a first embodiment of an interferometer system 1 according to a second aspect of the invention.

The interferometer system 1 is configured to determine a displacement of an object of interest 50, for example a cooling hood of a cooling system of a lithographic apparatus or its reference object, or any other object of interest of which a displacement of the object with respect to the interferometer system should be determined. A cooling hood is known from WO2018/041599A1, published on Mar. 8, 2018, hereby incorporated by reference. A cooling hood comprises a cooling element arranged above the substrate W, and is arranged to remove heat from the substrate W while the substrate W is held by the substrate support WT. The cooling hood may remove heat of a target portion C while, or shortly after, the target portion is being exposed via the projection system PS. The cooling hood may remove heat by providing a flow of gas onto the target portion C. To control the amount of heat that is being removed from the target portion C, the amount of flow of the gas may be controlled. Additional or alternatively, a distance between the target portion C and the cooling hood may be controlled to control the amount of heat that is being removed from the target portion C. The interferometer system 1 may be used to determine the distance between the cooling hood and the target portion C, the distance between the cooling hood and the substrate W, and/or the cooling hood and the substrate support WT.

The interferometer system 1 comprises a light source 2 to provide a radiation beam RAB, an optical system 3, a detector 4 and a processing unit 5.

The light source 2 is a laser source which provides a laser beam. The laser source 2 is for instance a distributed feedback laser (DFB laser) that allows the light frequency of the laser beam to be tuned by changing the injection current. The injection current may be modulated at 10 MHz frequency around a DC offset. This results in a modulation of the frequency of the laser beam at a rate of 10 MHz. Modulation of the laser current and hence the laser frequency is used to apply a synthetic heterodyne detection technique that allows to determine a displacement of the object of interest with respect to a reference on which the interferometer system 1 is mounted.

Any optical elements that are used to create the radiation beam RAB with desired characteristics, such as a modulation or a polarization, before entering the optical input fiber 8 may be regarded to be part of the light source 2.

The optical system 3 comprises a semi-transparent mirror 6 arranged to split the radiation beam RAB into a measurement beam MEB guided along a first optical path and a reference beam REB guided along a second optical path. In the embodiment shown in FIG. 9, the reference beam REB is formed by a part of the radiation beam RAB reflected by a reflective surface 6a of the semi-transparent mirror 6, and the measurement beam MEB is formed by a part of the radiation beam RAB which is transmitted through the semi-transparent mirror 6.

The measurement beam MEB is guided to and reflected by a retroreflector 51 or another reflective surface mounted on the object of interest 50 and returns to the semi-transparent mirror 6. The measurement beam MEB is at least partially reflected on a reflective back surface 6b of the semi-transparent mirror 6 back to the retro-reflector 51. The retroreflector 51 again reflects the measurement beam MEB back to the optical system 3 where the measurement beam MEB is, at least partially, transmitted through the semi-transparent mirror 6. The measurement beam MEB and the reference beam REB are recombined at a focus lens 7 of the optical system 3 to form a recombined beam REC.

An optical input fiber 8 is provided to guide the radiation beam RAB from the light source 2 to the optical system 3 and an optical output fiber 9 is provided to guide the recombined beam REC from the optical system 3 to the detector 4. The detector 4 receives the recombined beam REC and provides a detector signal on the basis of the recombined beam REC. The detector signal is fed into the processing unit 5 for processing of the detector signal. On the basis of the detector signal, a change in the position of the object of interest 50 with respect to the optical system 3 may be determined, as is known in the art.

The optical input fiber 8 is arranged with an output end 10 to emit the radiation beam RAB into the optical system 3, for instance at the focus lens 7. The optical output fiber 9 is arranged with an input end 11 to receive the recombined beam REC from the optical system 3, for instance from the focus lens 7. The output end 10 and the input end 11 are arranged at a distance d with respect to each other. The optical input fiber 8 is only used to guide light from the light source 2 to the optical system 3 and the optical output fiber 9 is only used to guide light from the optical system 3 to the detector 3. In other words both the optical input fiber 8 and the optical output fiber 9 are used to guide light only in one direction.

The optical system 3 is constructed to direct light received from the output end 10 of the optical input fiber 8 after splitting the radiation beam RAB and recombining into the recombined beam REC to the input end 11 of the optical output fiber 9. Hereto, the reflective surface 6a and the reflective back surface 6b of the semi-transparent mirror 6 are arranged at an angle α with respect to a plane perpendicular to the measurement direction MD, wherein the measurement direction is the direction in which the radiation beam is incident on the reflective surface 6a to form after reflection the reference beam REB and the direction in which the measurement beam MEB is incident on the reflective back surface 6b to be reflected back to the retroreflector 51, respectively. The angle α of the reflective surface 6a is the same as the angle α of the reflective back surface 6b.

The focus lens 7 has a focal length f. The relationship between the distance d, the focal length f and the angle α is as follows:

$$d = f \cdot \tan(2\alpha),$$

wherein d is the distance between the output end 10 and the input end 11, wherein f is the focal length of the focus lens 7, and wherein α is the angular difference between a plane perpendicular to the measurement direction MD and the non-perpendicular angle of the reflective surface 6a and the reflective back surface 6b, respectively.

When this relationship is fulfilled, the radiation beam RAB emitted from the output end 10 is, after splitting into the measurement beam MEB and the reference beam REB and recombining into the recombined beam REC, correctly directed at the input end 11. The distance d between the output end 10 of the optical input fiber 8 and the input end 11 of the optical fiber output fiber 9 is selected to be equal to or larger than a minimum value to prevent that stray light of the radiation beam RAB, the measurement beam MEB and/or reference beam REB is received by the input end 11 of the optical output fiber 9. The minimum value of d is dependent on different factors, such as the extent in which light strays in the optical system 3.

In the embodiment of FIG. 9, the optical system 3 is arranged in a probe head 12. The output end 10 of the optical input fiber 8 and the input end 11 of the optical output fiber 9 are pigtailed and directly connected to the probe head 12. In an alternative embodiment, the probe head 12 may comprise an input connector to connect the output end 10 of the optical input fiber 8 and an output connector to connect the input end 11 of the optical output fiber 9. The probe head 12 itself, in particular its optical system 3, is free of optical fibers.

The advantage of this construction of the probe head 12 is that the probe head 12 may be of compact design. Also, a small retroreflector 51 can be provided on the object of interest 50 without being susceptible for lateral shifts of the optical path of the measurement beam in a direction perpendicular to the measurement direction. Furthermore, the dual pass configuration of the interferometer system 1 provides an increased measurement resolution compared to a single-pass configuration. Another advantage may be that the angle α helps to prevent ghost reflections propagating to the optical output fiber 9.

Figure 10:
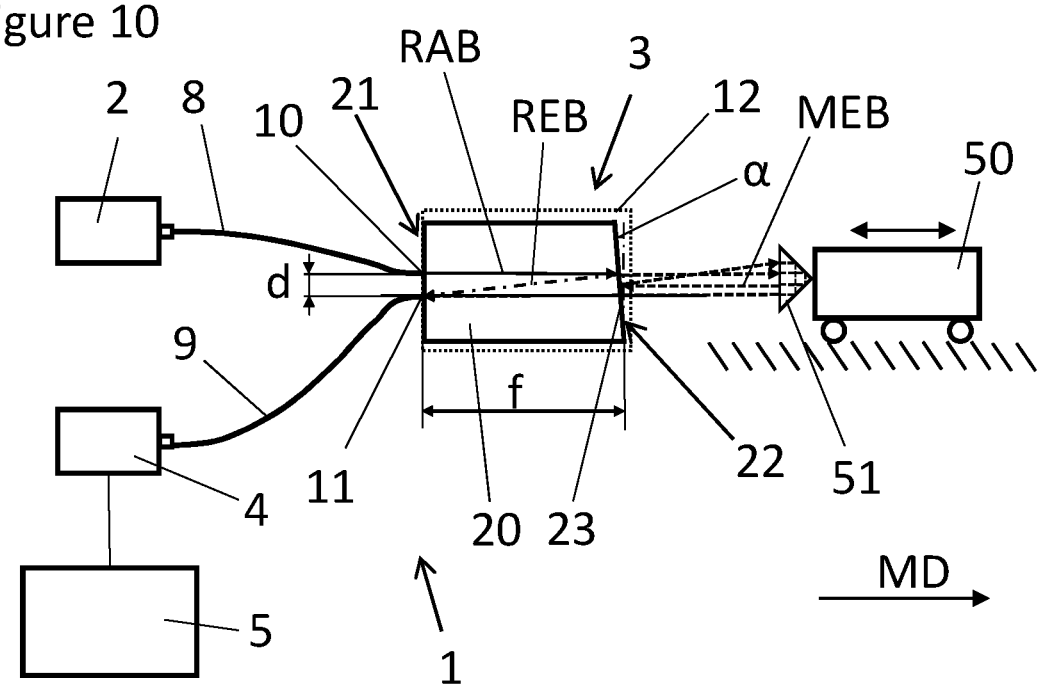
FIG. 10 shows schematically a second embodiment of an interferometer system according to a second aspect of the invention.

FIG. 10 shows a second embodiment of an interferometer system 1 according to a second aspect of the invention.

The interferometer system 1 of FIG. 10 comprises corresponding to the embodiment of FIG. 9, a light source 2, for example a laser source, an optical system 3, a detector 4 and a processing unit 5. In the optical system 3, a radiation beam RAB provided by the light source 3 is split into a measurement beam MEB and a reference beam REB. After the measurement beam MEB is reflected at least once on a reflective surface, for example a retroreflector 51, mounted on the object of interest 50, the measurement beam MEB is recombined by the optical system 3 with the reference beam REB to form a recombined beam. The recombined beam is guided to the detector 4 to provide a detector signal representative for a change in position of the object of interest 50. By processing of the detector signal in the processing unit 5, this change in position of the object of interest 50 may be determined and used to determine a displacement of the object of interest 50.

An optical input fiber 8 is provided to guide the radiation beam RAB provided by the light source 2 to the optical system 3 and an optical output fiber 9 is provided to guide the recombined beam to the detector 4. Also in this embodiment, the optical system 3 itself does not comprise any optical fibers and the optical input fiber 8 and the optical output fiber 9 are used to guide light only in a single direction.

In the embodiment of FIG. 10, the optical system 3 comprises a gradient index lens having a lens body 20 with a main light axis parallel to the measurement direction MD. The shown gradient index lens is a cylindrical, transparent optical component having a refractive index which gradually increases in radial direction towards the longitudinal axis of the cylindrical shape. This longitudinal axis is the main light axis parallel to the measurement direction MD. The refractive index may for example decrease quadratically with increasing radial distance from the longitudinal axis. Such gradient index lens may be used as a convergent lens.

The lens body 20 comprises a fiber side 21 and a light side 22 opposite to the fiber side 21. The output end 10 of the optical input fiber 8 and the input end 11 of the optical output fiber 9 are arranged at the fiber side 21 of the lens body 20, typically as pigtailed fibers that are directly connected, for example glued or fused, to the lens body 20. An outer surface 23 of the lens body 20 at the light side 22 is arranged at a non-perpendicular angle with the main light axis of the lens body 20. This outer surface 23 acts as a semi-reflective surface that splits the radiation beam RAB into a measurement beam MEB and a reference beam REB.

The reference beam REB is the part of the radiation beam RAB that is reflected by the outer surface 23 back into the lens body 20 and will be focused by the lens body 21 to the input end 11 of the optical output fiber 9. The part of the radiation beam RAB transmitted by the outer surface 23 forms the measurement beam MEB and will be reflected by the retroreflector 51, at least partially reflected by the outer surface 23, once again reflected by the retroreflector 51 and then at least partially transmitted by the outer surface 23. This part of the measurement beam MEB will be focused by the lens body 21 to the input end 11 of the optical output fiber 9. In the lens body 20 or at the input end 11 of the output fiber 9, the measurement beam MEB and the reference beam REB will be recombined into the recombined beam that will be guided by the optical output fiber 9 to the detector 3. The paths of the beams are schematically indicated. In practice, the beams may, in particular in the lens body 20, follow non-straight paths.

The distance d between the output end 10 and the input end 11, the focal length f of the gradient index lens and the angle of the non-perpendicular outer surface 23 are selected such that the light emitted from the output end 10 into the optical system 3 will be guided by the optical system 3 to the input end 11 of the optical output fiber 9. The relationship between this distance, focal length and angle is:

$$d = f * \tan(2\alpha),$$

wherein d is the distance between the output end 10 and the input end 11, wherein f is a focal length of the gradient index lens, wherein α is the difference between the non-perpendicular angle and a plane perpendicular with respect to the main light axis of the lens body 20.

In the embodiment of FIG. 10, the optical system 3, in particular the gradient index lens, may be arranged in a probe head 12. This may result in a small probe head 12.

Figure 11:
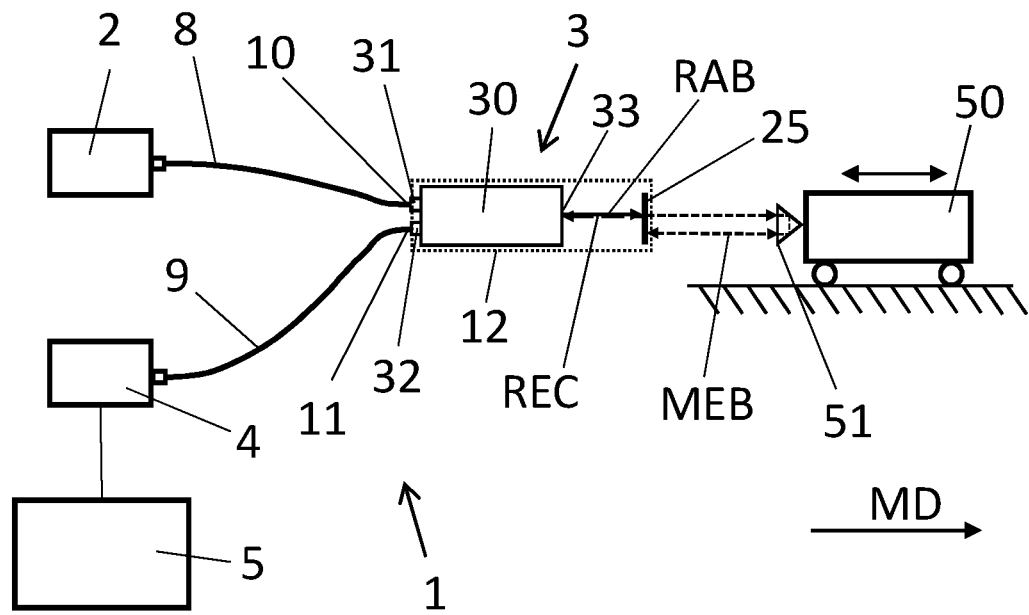
FIG. 11 shows schematically a third embodiment of an interferometer system according to a second aspect of the invention.

FIG. 11 shows a third embodiment of an interferometer system 1 according to a second aspect of the invention.

The interferometer system 1 of FIG. 11 comprises corresponding to the embodiment of FIG. 9, a light source 2, for example a laser source, an optical system 3, a detector 4 and a processing unit 5. In the optical system 3, a radiation beam RAB provided by the light source 3 is split at a semi-transparent mirror 25 into a measurement beam MEB and a reference beam. After the measurement beam MEB is reflected at least once on a reflective surface, for example a retroreflector 51, mounted on the object of interest 50, the measurement beam MEB is recombined by the optical system 3 with the reference beam REB to form a recombined beam REC. The recombined beam REC is guided to the detector 4 to provide a detector signal representative for a change in position of the object of interest 50. By processing of the detector signal in the processing unit 5, this change in position of the object of interest 50 may be determined and used to determine a position of the object of interest 50.

An optical input fiber 8 is provided to guide the radiation beam RAB provided by the light source 2 to the optical system 3 and an optical output fiber 9 is provided to guide the recombined beam to the detector 4. Also in this embodiment, the optical system 3 itself does not comprise any optical fibers and the optical input fiber 8 and the optical output fiber 9 are used to guide light only in a single direction.

The optical system 3 of the embodiment of FIG. 11 comprises a circulator 30. The circulator 30 comprises, at one side, a first fiber port 31 to which an output end 10 of the optical input fiber 8 is connected, and a second fiber port 32 to which an input end 11 of the optical output fiber 9 is connected. At the other side, a light port 33 is arranged to emit and receive light. The circulator 30 is arranged to guide the radiation beam RAB received from the output end 10 of the optical input fiber 8 to the light port 33 such that the radiation beam RAB is emitted from the light port 33. The circulator 30 is further arranged to guide the recombined beam REC received at the light port 33 to the input end 11 of the optical output fiber 9.

The circulator 30 and the semi-transparent mirror 25 may be arranged in a probe head 12. Such probe head 12 may be small and light weight. Also, this embodiment may have low susceptibility for lateral shifts of the retroreflector 51 perpendicular to the measurement direction MD.

Hereinabove, three embodiments of an interferometer system 1 according to the second aspect of the invention are described that can be provided as a small and lightweight probe head 12 that is only connected by optical fibers 8, 9 to other components of the interferometer system 1. Such a probe head can advantageously be used to determine a displacement of an object of interest 50 with respect to a reference object of a lithographic apparatus. In addition, these embodiments may be used in combination with a small retroreflector 51 mounted on the object of interest. The object of interest 50 may be, for example, a cooling hood of a cooling system or an immersion hood of a lithographic apparatus, or a reference object with respect to which a position of such object is to be measured. For example, the probe head 12 may be mounted on a cooling hood to determine a displacement of a reference object. This also results in measurement of the displacement of the cooling head with respect to the reference object. The interferometer system may also be used to determine a displacement of any other object of interest or the displacement of a reference object.

The interferometer system may also be applied in other systems or devices, such as a metrology apparatus, an e-beam apparatus and other apparatus.

In some embodiments, it may be advantageous that the movements of the object of interest are within a small range of movement.

A common characteristic of the three embodiments according to the second aspect of the invention is that the optical system 3 that may be provided in the probe head 12 is connected to an optical input fiber 8 and an optical output fiber 9 and that the optical system 3 itself is free from optical fibers. In such optical system 3, the light coming from an output end 10 of one optical fiber 8 is guided further to the input end 11 of a second optical fiber 9. No light passes in two opposite directions through one of the two optical fibers 8, 9. This may be advantageous for routing of the two optical fibers 8, 9.

The optical paths within the optical system 3 and towards and from the reflective surface on the object of interest 50 may differ in different applications. For example single pass or double pass set-ups may be applied. Also, the input end and the output end may be arranged at different locations, and do not have to be arranged next to each other.

Embodiments are provided are according to the following clauses:

1. An interferometer system to determine a position of a movable object, comprising:
   a laser source to provide a radiation beam,
   an optical system arranged to split the radiation beam into a first beam along a first optical path and a second beam along a second optical path, wherein the optical system is arranged to recombine the first beam and the second beam to a recombined beam,
   a detector to receive the recombined beam and to provide a detector signal on the basis of the received recombined beam, and
   a processing unit to process the detector signal,
   wherein a first optical path length of the first optical path and a second optical path length of the second optical path have an optical path length difference,
   wherein the processing unit is arranged to determine a mode hop of the laser source on the basis of a phase shift in the detector signal resulting from such mode hop.
2. The interferometer system of clause 1, wherein the optical path difference is selected such that a phase shift resulting from a mode hop is unequal to $2\pi$.
3. The interferometer system of clause 1 or clause 2, wherein the optical path length difference is unequal to $k*c/\Delta f$, wherein k is an integer, c is the speed of light and $\Delta f$ is a frequency difference caused by a mode hop.
4. The interferometer system of any of clauses 1-3, wherein the optical path length difference is equal to $(r+k)*c/\Delta f$, wherein r is in the range of 0.1 to 0.9, k is an integer, c is the speed of light and $\Delta f$ is a frequency difference caused by a mode hop.
5. The interferometer system of clause 4, wherein k is 0, 1 or 2.
6. The interferometer system of any of clauses 1-5, wherein the processing unit is arranged to observe changes in a derivative of the phase shift in the detector signal in order to determine the mode hop of the laser source.
7. The interferometer system of any of clauses 1-6, wherein the interferometer system is a heterodyne interferometer system, and wherein at least one of the first beam and the second beam is guided through a frequency shift device to create a frequency difference between a first frequency of the first beam and a second frequency of the second beam.
8. The interferometer system of any of clauses 1-7, wherein the recombined beam is used as a reference beam and the detector is a reference detector.
9. The interferometer system of any of clauses 1-8,
   wherein the laser source comprises a tunable laser source arranged to provide the radiation beam with a tunable light frequency,
   wherein the interferometer system further comprises a fixed frequency laser source to provide a second radiation beam with a fixed light frequency,
   wherein the interferometer system is arranged to determine an absolute position of the movable object.
10. A method of determining a mode hop of a laser source of an interferometer system, comprising:
    emitting a radiation beam from the laser source,
    splitting the radiation beam into a first beam which is guided along a first optical path and a second beam which is guided along a second optical path, wherein a first optical path length of the first optical path and a second optical path length of the second optical path have an optical path length difference,
    recombining the first beam and the second beam into a recombined beam,
    providing a detector signal on the basis of the recombined beam, and
    processing the detector signal to determine the mode hop of the laser source on the basis of a phase shift in the detector signal resulting from such mode hop.
11. The method of clause 10, wherein the method comprises observing changes in a derivative of the phase shift in the detector signal in order to determine the mode hop of the laser source.
12. The method of clause 10 or clause 11, wherein the method comprises guiding at least one of the first beam and the second beam through a frequency shift device to create a frequency difference between a first frequency of the first beam and a second frequency of the second beam.
13. A method of determining a position of a movable object using the interferometer system of any of clauses 1-9, the method comprising:
    measuring a position of the movable object,
    determining whether a mode hop of the laser source of the interferometer system occurred during measuring of the position of the movable object,
    if no mode hop occurred, using the measured position, and
    if a mode hop occurred, ignoring the measurement results associated with the mode hop and/or repeating the steps of measuring the position of the movable object and determining whether a mode hop occurred during measuring.
14. A lithographic apparatus comprising:
    a mask support constructed to support a patterning device having a pattern,
    a substrate support constructed to support a substrate;
    a projection system arranged to project the pattern onto the substrate, wherein one of the mask support, the substrate support or the projection system comprises a movable object; and
    an interferometer system as claimed in any of clauses 1-9 to determine the position of the movable object.
15. A lithographic apparatus, comprising:
    a mask support constructed to support a patterning device having a pattern,
    a substrate support constructed to support a substrate having a marker;
    a projection system arranged to project the pattern onto the substrate;
    an alignment system arranged to measure a position of the marker; and
    an interferometer system as claimed in any of clauses 1-9,
    wherein the recombined beam is used as a measurement beam and the detector is a measurement detector, wherein the measurement beam is reflected on a reflective measurement surface arranged or connected to the projection system or the alignment system before being received by the measurement detector.

16. An interferometer system to determine a displacement of an object of interest, comprising:
   a light source to provide a radiation beam,
   an optical system arranged to split the radiation beam into a measurement beam along a first optical path and a reference beam along a second optical path, wherein the optical system is arranged to recombine the measurement beam and the reference beam to a recombined beam,
   a detector to receive the recombined beam and to provide a detector signal on the basis of the received recombined beam,
   a processing unit to process the detector signal,
   an optical input fiber to guide the radiation beam from the light source to the optical system, and
   an optical output fiber to guide the recombined beam from the optical system to the detector, wherein the optical input fiber and the optical output fiber are different fibers.

17. The interferometer system of clause 16, wherein the interferometer system comprises a probe head, wherein the optical system is arranged in the probe head, wherein the optical input fiber and the optical output fiber are connected to the probe head.

18. The interferometer system of clause 16 or clause 17, wherein the optical system is free of optical fibers.

19. The interferometer system of any of clauses 16-18, wherein the optical system comprises at least one reflective surface at a non-perpendicular angle with an optical path of the radiation beam, the measurement beam, the reference beam and/or the recombined beam reflected on the reflective surface.

20. The interferometer system of clause 19, wherein the at least one reflective surface comprises a semi-transparent mirror arranged to split the radiation beam into the measurement beam and the reference beam.

21. The interferometer system of clause 19 or clause 20, wherein the optical system comprises a first reflective surface arranged at a first non-perpendicular angle with the first optical path of the measurement beam and a second reflective surface arranged at a second non-perpendicular angle with the second optical path of the reference beam.

22. The interferometer system of clause 21, wherein the first non-perpendicular angle and the second non-perpendicular angle are the same.

23. The interferometer system of any of clauses 19-22, wherein the at least one reflective surface is arranged to reflect the radiation beam, reference beam and/or the measurement beam.

24. The interferometer system of any of clauses 19-23, wherein the optical system comprises a gradient index lens having a lens body with a main light axis, wherein the lens body comprises a fiber side and a light side opposite to the fiber side, wherein the optical input fiber and the optical output fiber are arranged at the fiber side of the lens body, wherein at least the measurement beam is emitted and received at the light side, and wherein an outer surface of the lens body at the light side is arranged at a non-perpendicular angle with the main light axis to define the at least one reflective surface at the non-perpendicular angle.

25. The interferometer system of any of clauses 19-24, wherein the optical system comprises a focus lens to receive the radiation beam from an output end of the optical input fiber and to focus the recombined beam into an input end of the optical output fiber, wherein the output end and the input end are spaced at a distance of:

$d = f * \tan(2\alpha)$, wherein d is the distance between the output end and the input end, wherein f is a focal length of the focus lens, wherein $\alpha$ is the angular difference between the non-perpendicular angle and a plane perpendicular with the optical path.

26. The interferometer system of clause 25, wherein the distance between the output end of the optical input fiber and the input end of the optical fiber output fiber is selected to be equal to or larger than a minimum value to prevent that stray light of the radiation beam, measurement and/or reference beam is received by the input end of the optical output fiber.

27. The interferometer system of any of clauses 16-18, wherein the optical system comprises a circulator, having a first fiber port to which the optical input fiber is connected, a second fiber port to which the optical output fiber is connected, and a light port which is arranged to emit and receive light, wherein the circulator is arranged to guide the radiation beam received from the optical input fiber to the light port and to guide the recombined beam received at the light port to the optical output fiber.

28. The interferometer system of clause 17 and 27, wherein the circulator is arranged in the probe head.

29. A lithographic apparatus comprising:
   a mask support constructed to support a patterning device having a pattern,
   a substrate support constructed to support a substrate;
   a projection system arranged to project the pattern onto the substrate, wherein one of the mask support, the substrate support or the projection system comprises an object of interest; and
   an interferometer system as claimed in any of clauses 16-28 to determine the position of the object of interest.

30. A lithographic apparatus, comprising:
   a mask support constructed to support a patterning device having a pattern,
   a substrate support constructed to support a substrate having a marker;
   a projection system arranged to project the pattern onto the substrate;
   a cooling hood to provide cooling; and
   an interferometer system as claimed in any of clauses 16-28 to determine a position of the cooling hood.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A heterodyne interferometer system to determine a position of a movable object, the interferometer system comprising:
   an optical system arranged to split a radiation beam from a laser source into a first beam along a first optical path and a second beam along a second optical path, wherein the optical system is arranged to recombine the first beam and the second beam to a recombined beam,
   a detector to receive the recombined beam and to provide a detector signal on the basis of the received recombined beam, and
   a processing unit to process the detector signal,
   wherein a first optical path length of the first optical path and a second optical path length of the second optical path have an optical path length difference,
   wherein the first beam and/or second beam is guided through a frequency shift device to create a frequency difference between a first frequency of the first beam and a second frequency of the second beam,
   wherein the processing unit is configured to determine a mode hop of the laser source on the basis of a phase shift in the detector signal resulting from such mode hop.

2. The interferometer system of claim 1, wherein the optical path difference is selected such that a phase shift resulting from a mode hop is unequal to $2\pi$.

3. The interferometer system of claim 1, wherein the optical path length difference is unequal to $k*c/\Delta f$, wherein k is an integer, c is the speed of light and $\Delta f$ is a frequency difference caused by a mode hop.

4. The interferometer system of claim 1, wherein the optical path length difference is equal to $(r+k)* c/\Delta f$, wherein r is in the range of 0.1 to 0.9, k is an integer, c is the speed of light and $\Delta f$ is a frequency difference caused by a mode hop.

5. The interferometer system of claim 4, wherein k is 0, 1 or 2.

6. The interferometer system of claim 1, wherein the processing unit is configured to observe changes in a derivative of the phase shift in the detector signal in order to determine the mode hop of the laser source.

7. The interferometer system of claim 1, wherein the recombined beam is used as a reference beam and the detector is a reference detector.

8. The interferometer system of claim 1, further comprising:
   a tunable laser source arranged to provide the radiation beam with a tunable light frequency, and
   a fixed frequency laser source to provide a further radiation beam with a fixed light frequency,
   wherein the interferometer system is arranged to determine an absolute position of the movable object.

9. A method of determining a position of a movable object using the interferometer system of claim 1, the method comprising:
   measuring a position of the movable object,
   determining whether a mode hop of the laser source of the interferometer system occurred during measuring of the position of the movable object,
   if no mode hop occurred, using the measured position, and
   if a mode hop occurred, ignoring the measurement results associated with the mode hop and/or repeating the measuring the position of the movable object and determining whether a mode hop occurred during measuring.

10. A non-transitory computer-readable medium having instructions therein, the instructions, when executed by a computer system, configured to cause the computer system to cause carrying out of the method as claimed in claim 9.

11. A lithographic apparatus comprising:
    a mask support constructed to support a patterning device having a pattern;
    a substrate support constructed to support a substrate;
    a projection system arranged to project the pattern onto the substrate, wherein the mask support, substrate support or projection system comprises a movable object; and,
    the interferometer system as claimed in claim 1 to determine the position of the movable object.

12. A lithographic apparatus, comprising:
    a mask support constructed to support a patterning device having a pattern;
    a substrate support constructed to support a substrate having a marker;
    a projection system arranged to project the pattern onto the substrate;
    an alignment system arranged to measure a position of the marker; and
    the interferometer system as claimed in claim 1,
    wherein the recombined beam is used as a measurement beam and the detector is a measurement detector, and
    wherein the measurement beam is reflected on a reflective measurement surface arranged or connected to the projection system or the alignment system before being received by the measurement detector.

13. A lithographic apparatus comprising:
    a mask support constructed to support a patterning device having a pattern;

a substrate support constructed to support a substrate;

a projection system arranged to project the pattern onto the substrate, wherein the mask support, substrate support or projection system comprises an object of interest; and the interferometer system as claimed in claim 1 to determine the position of the object of interest.

14. A method of determining a mode hop of a laser source of an interferometer system, the method comprising:

splitting a radiation beam from the laser source into a first beam which is guided along a first optical path and a second beam which is guided along a second optical path, wherein a first optical path length of the first optical path and a second optical path length of the second optical path have an optical path length difference, guiding the first beam and/or second beam through a frequency shift device to create a frequency difference between a first frequency of the first beam and a second frequency of the second beam, recombining the first beam and the second beam into a recombined beam, providing a detector signal on the basis of the recombined beam, and processing the detector signal to determine the mode hop of the laser source on the basis of a phase shift in the detector signal resulting from such mode hop.

15. The method of claim 14, further comprising observing changes in a derivative of the phase shift in the detector signal in order to determine the mode hop of the laser source.

\* \* \* \* \*